United States Patent

Arai et al.

[11] Patent Number: 5,901,781
[45] Date of Patent: May 11, 1999

[54] HEAT RADIATOR FOR ELECTRONIC PARTS

[76] Inventors: Seihachi Arai; Toshiyuki Arai, both of 552-2, Nishi-cho, Soka-shi, Saitama-ken, Japan

[21] Appl. No.: 08/801,472

[22] Filed: Feb. 18, 1997

[30] Foreign Application Priority Data

Feb. 17, 1996 [JP] Japan .................................. 8-054127
May 24, 1996 [JP] Japan .................................. 8-153463

[51] Int. Cl.$^6$ ........................................................... H05K 7/20
[52] U.S. Cl. ......................... 165/80.3; 165/185; 174/16.3; 257/718; 361/704
[58] Field of Search ................................. 165/80.3, 185; 174/16.3; 257/718, 719; 361/704, 707

[56] References Cited

U.S. PATENT DOCUMENTS

| | | | |
|---|---|---|---|
| 3,893,161 | 7/1975 | Pesak, Jr. ............................ | 174/16.3 X |
| 4,054,901 | 10/1977 | Edwards et al. .................... | 174/16.3 X |
| 4,261,005 | 4/1981 | McCarthy ........................... | 174/16.3 X |
| 4,544,942 | 10/1985 | McCarthy ........................... | 174/16.3 X |
| 4,691,765 | 9/1987 | Wozniczka ......................... | 165/80.3 |
| 4,729,426 | 3/1988 | Hinshaw ............................. | 165/80.3 |
| 5,576,933 | 11/1996 | Campanella et al. ............... | 361/704 |

Primary Examiner—Leonard Leo
Attorney, Agent, or Firm—Nikaido, Marmelstein, Murray & Oram LLP

[57] ABSTRACT

The invention mainly relates to a heat radiator for performing heat radiation of electronic parts (heat generating elements) that are heated by electric supply, such as semiconductor parts to be mounted on a circuit board surface of a printed circuit board. The heat radiator (1) according to the present invention is a heat radiator in which vertical heat radiative portions are formed by bending both right and left ends of a back surface plate (2) to the front face side. The heat generating element (5) that is an electronic part is mounted on the surface on the front face side or the back face side of the back surface plate. The radiating portions are further bent inwardly to form sleeve portions (3) extending up and down. Slits (12a) are formed on outer peripheral walls of the sleeve portions (3) for ventilating air. Inside the right and left sleeve portions (3), the bent back end sides of the peripheral walls of the sleeve portions (3) form bent back portions (4) bent and formed along the back surface plate. Furthermore, plate-like pressure portions (26) are provided in the inner end side of the bent back portions (4). The heat generating element (5) is inserted in between the back faces of the pressure portions (26) and the front surface of the back surface plate (2) and held in place by the pressure plate (26) and the back surface plate (2) to thereby define a part mountable space made of a space for securely holding the heat generating element (5).

2 Claims, 8 Drawing Sheets

FIG. 3A  FIG. 3B  FIG. 3C
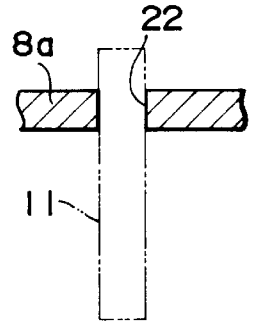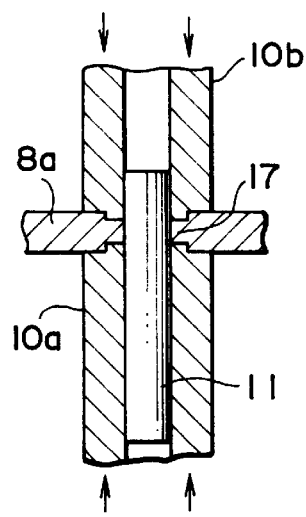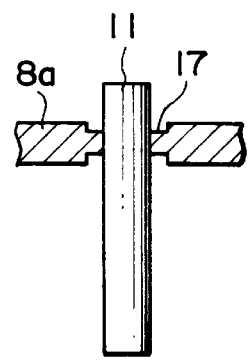
FIG. 4A  FIG. 4B
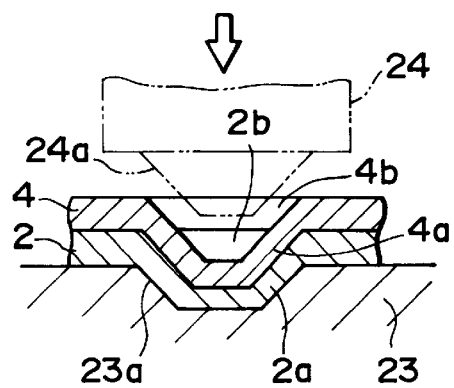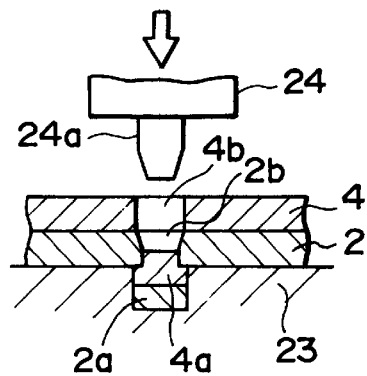

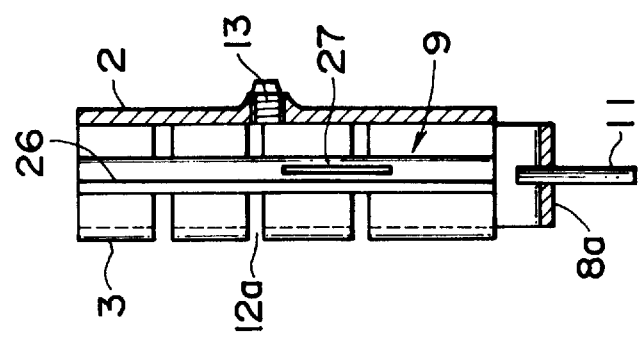
F I G. 5C
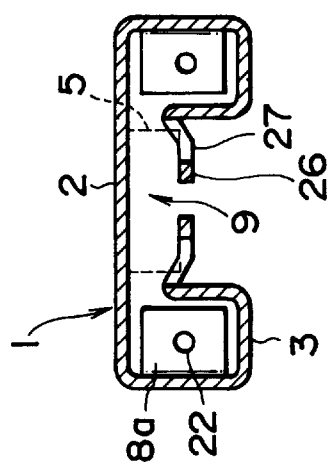
F I G. 5B
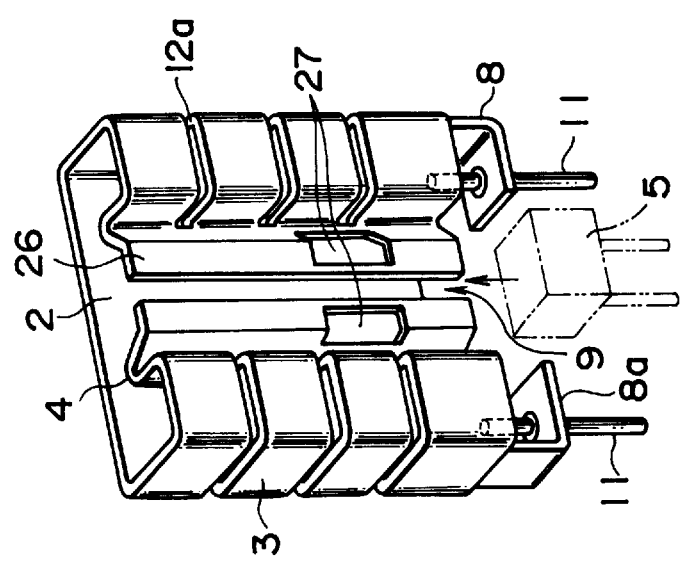
F I G. 5A

F I G. 15
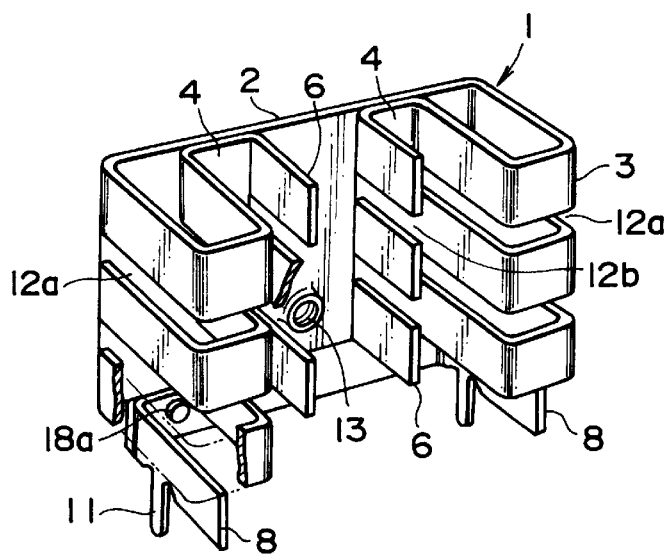
F I G. 16
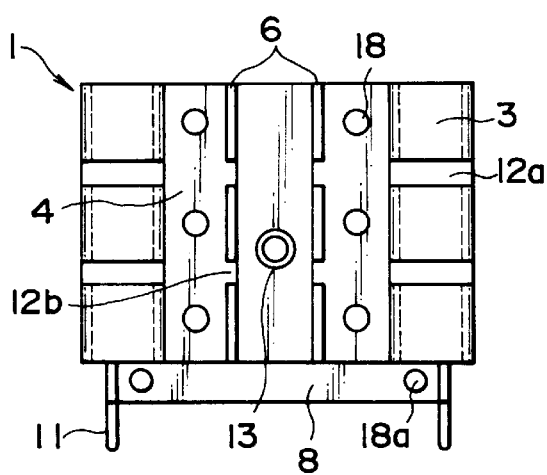
F I G. 17
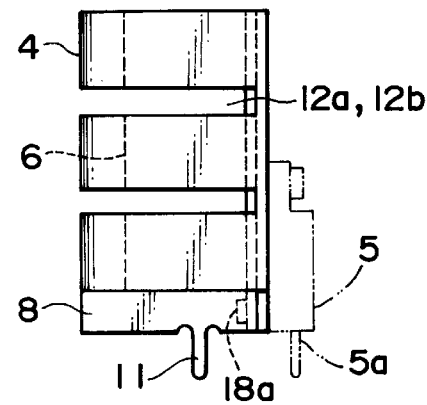

HEAT RADIATOR FOR ELECTRONIC PARTS

BACKGROUNDS OF THE INVENTION

1. Field of the Invention

The present invention relates to a heat radiator for radiating heat of electronic parts (heat generating elements) that radiates heat by electric supply, typically, such as a semiconductor parts mounted on a circuit board surface of a printed circuit board.

2. Description of the Prior Art

For instance, a conventional radiator is well known in which, as shown in FIG. 19, a sleeve member 52 formed and bent into a bellows is fixed to a back surface plate 51 made of aluminum alloy and a heat generating element a is mounted below the sleeve member 52. Bracket-like leg seats 54 provided with leg pins 55 for insert-fitting to a circuit board are mounted on both lower sides of the above-described heat generating element a.

Rail-like projections 53 extending in the lateral way are formed on an upper side of the surface of the back surface plate 51 for mounting the sleeve member 52 on the back surface plate 51. Then, press-fitting slits 50 for engagement with the above-described projections 53 are formed in a base end portion of the sleeve member 52. The sleeve member 52 is fixed to the back surface plate 51 by press-fitting the projecting surfaces of the projections 53.

Also, with respect to the leg seat 54, pin holes 57 formed in a side of each leg seat 54 hating an L-shaped cross-section are fitted with rivets 56 projecting from the surface by being pressed from the back surface of the back surface plate 51. The projecting end of each pin (rivet) 56 is press-fitted to be fixed to the back surface plate 51 in a one-piece manner. Reference numeral 58 denotes a positioning pin for the leg seat 54.

The conventional radiator having the above-described structure radiates heat of the lower heat generating element a mainly by the upstream flow of air within the sleeve member 52. However, since the back surface plate 51 and the sleeve member 52 are formed separately, the conventional radiator suffers from such various disadvantages that the press-fitting work is performed in an independent step after the back surface plate 51 and the sleeve member 52 are formed separately; the press-fitting portions have to be formed in the back surface plate 51; and the thickness has to be increased, thereby increasing in cost for production.

In addition, a volume of the overall radiator is disadvantageously increased, resulting in degraded heat radiation.

SUMMARY OF THE INVENTION

A first object of the present invention is to provide a simple and light weight structure in which a heat radiator may be bent and punched by pressing a web of metal sheet made of, for example, aluminum to enhance the heat radiative characteristics of a heat generating element in low cost.

A second object of the present invention is to facilitate the assembling work of a heat generating element and a radiator, and further to enhance the heat radiative characteristics of the radiator by holding the heat generating element by the radiator, per se, or by positioning the heat generating element in place.

A third object of the present invention is to provide a variety of kinds of radiators that have various kinds of holding structures, so that the best radiator may be selected for use in compliance with a shape and size of the heat generating element, a quantity of heat generation, a size of mountable space on a circuit board, or the like.

Other detailed objects will be understood more apparently when reading the following specific explanation and description.

The features of the present invention to attain the above-described and other objects will become apparent by the following description.

A first feature of the intention resides in a heat radiator, in which both right and left ends of a back surface plate 2 on which a heat generating element 5 that is an electronic part is mounted on a surface on a front face side are bent on the front face side or on the back face side to form a heat radiative portion in a longitudinal direction, characterized in that said radiative portion is bent further inwardly to form a vertical sleeve portion 3; and slits 12a are formed in a peripheral wall of said sleeve portion 3 for causing air to flow.

A second feature of the invention is that a bent back portion 4 is formed to be bent toward the back surface plate 2 inside right and left sleeve portions 3 by bending bent-back end sides of the peripheral walls of the sleeve portions 3.

A third feature of the invention is that the bent back portion 4 is formed so as to come into contact with the front face of the back surface plate 2 along the front face and is securely fixed to the back surface plate 2.

A fourth feature of the invention is that an inner end of the bent back portion 4 is raised upright on the front face side of the back surface plate 2 to be an upright plate for heat radiation.

A fifth feature of the invention is that a plate-like pressure portion 26 is formed on the inner end of the bent back portion 4, and the heat generating element 5 is inserted in between a back surface of the pressure portion 26 and the front face of the back surface plate 2 to be held between the pressure portion 26 and the back surface plate 2 so that a part mountable space 9 is composed of a space for securely holding the heat generating element 5.

A sixth feature of the invention is that a positioning portion 27 is composed of a recess portion for receiving a part of the heat generating element 5 on a back surface side of the bent back portion 4 and for positioning and retaining the heat generating element 5 at a predetermined position on the front face side of the back surface plate 2.

A seventh feature of the invention is that the peripheral wall end inside the sleeve portion 3 is slanted inwardly so as to form V-shape in cooperation with the back surface plate 2 to form a retainer plate 3a, and a part mountable space 9 is composed of a space for depressing and holding the heat generating element by inserting the heat generating element 5 in between the back face side of the retainer plate 3a and the back surface plate 2.

Furthermore, an eighth feature of the invention is that the positioning portion 27 is provided on a back face side of the peripheral wall end of the sleeve portion 3 for receiving, positioning and fixing front face side corner portions of the heat generating element 5.

BRIEF DESCRIPTION OF THE DRAWINGS

In the accompanying drawings:

FIGS. 3A to 3C are enlarged cross-sectional views showing a leg pin mounting structure and a method therefor.

FIGS. 4A and 4B are enlarged side elevational cross-sectional view and frontal cross-sectional view showing a press-fitting structure for metal plates together.

FIGS. 5A, 5B and 5C are a perspective view, a plan view and a longitudinal sectional view showing a heat radiator in accordance with a second embodiment of the invention.

FIG. 15 is a perspective view showing a heat radiator in accordance with a sixth embodiment of the invention.

FIG. 16 is a frontal view showing the heat radiator shown in FIG. 16.

FIG. 17 is a side elevational view showing the heat radiator shown in FIG. 15.

DETAILED DESCRIPTION OF THE PREFERRED EMBODIMENT

Figure 1:
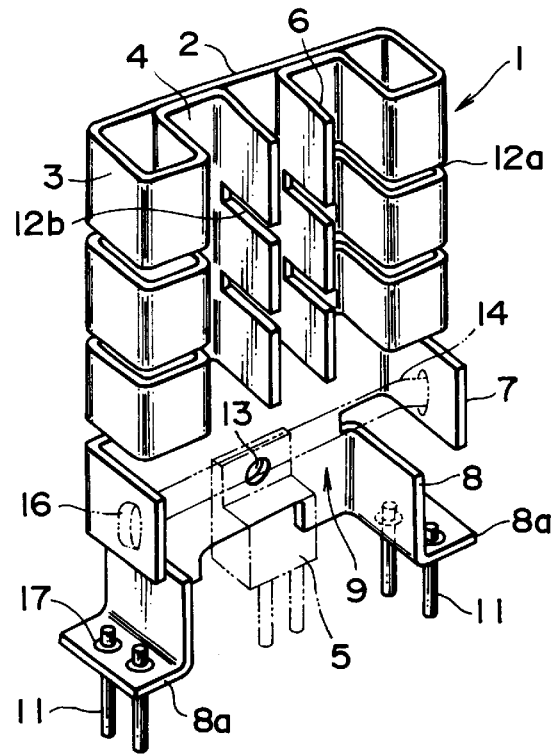
FIG. 1 is an overall perspective view showing a heat radiator according to a first embodiment of the invention.
Figure 2A:
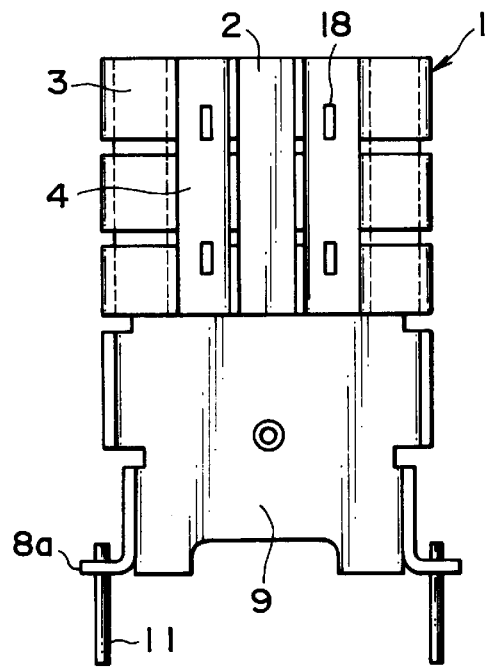
FIGS. 2A and 2B are frontal view and a side elevational view showing the heat radiator.
Figure 2B:
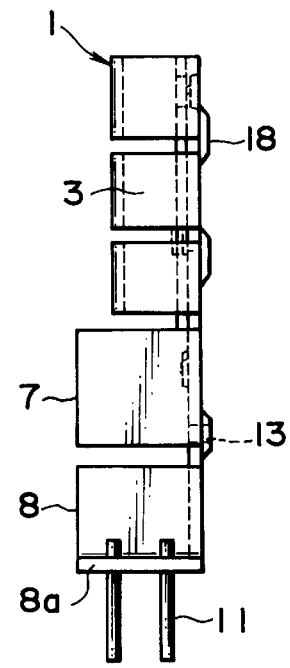

The present invention will now be described with reference to the accompanying drawings.

FIGS. 1 to 4 shows a radiator according to a first embodiment of the invention. In this embodiment, an overall radiator 1 is made of aluminum by pressing a thin aluminum plate having a thickness of, for example, 1 mm. Both end sides of a back surface plate 2 are bent together on the front side to form hollow portions 3 extending in the vertical direction.

Inner end sides of peripheral walls of the sleeve portions 3 formes channel-shaped bent-back portions 4 along the front face of the back surface plate 2. The back surfaces of the bent-back portions 4 are formed to be flat to be in overlapping contact with the surface of the back surface plate 2. Inner bent-back ends 6 of the respective bent-back portions 4, 4 are in an upright position on the front face side inside the bent-back portions 4, 4, so that a vertical groove portion is formed between the bent-back portions 4, 4 via a certain interval. The groove portion between the bent-back ends 6, 6 may be used as a mountable space 9 for a heat generating element 5 as described in conjunction with FIGS. 15 to 17.

Side walls 7 separated through slits from the sleeve portions 3 are bent toward the front side in an upright position are formed in the lower side of the sleeve portions 3 of the back surface plate 2 on both side ends, respectively. Leg seats 8 that form an L-shaped cross-section as viewed from the front side is integrally bent and formed at right and left ends of the back surface plate 2 below each side wall 7 with their lower ends forming pin seats 8a extending in both sides of the radiator 1.

A mountable space 9 surrounded by the side walls 7 and the leg seats 8 from both sides is formed below the sleeve portions 3 and the bent-back ends 6 for the heat generating element 5 or the like. Pins 11 extending vertically downwardly are provided as legs for insertion into the circuit board are formed in the pin seats 8a.

Ventilation slits 12a and 12b are formed at a position that divides a vertical height into about one third in the hollow portions 3, the peripheral walls and bent-back ends 6. The slits 12a and 12b enhance the heat radiative characteristics of the sleeve portions 3. The heat generating member 5 may be fixed to a stud hole 13 formed in the back surface plate 2 in a stud-fastening manner. However, as shown in FIG. 1, it is possible to resiliently press and fix the heat generating element 5 to the back surface plate 2 by a leaf spring 14 inserted at both ends into and retained at both ends at punched-out portions (concave portions) 16 formed from the inside of side walls 7, 7.

In order to insert the leg pins 11 to the pin seats 8a and to fix the leg pins 11 to the pin seats 8a as shown in FIGS. 3A, 3B and 3C, the pins 11 are fitted into the pin holes 22 formed in the pin seats 8a. Cylindrical punches 10a and 10b are applied from the outside from the upper and lower (top and bottom) protecting ends of each pin 11. The punches 10a and 10b are pressed to each other in the application direction.

As a result, annular convex and concave portions are formed in correspondence with the end face shapes of the punches 10a and 10b in the top and bottom outer peripheral positions of the pins 11 of the pin seats 8a. The thickness of the portion of the pin seats 8a is decreased to form press-fit portions 17 for pressing and fastening the pins 11 from the outside. It is possible to use a single punch for performing the press-fitting work to form the press-fit portion 17 only on one side of the pin seat 8a.

The back surface side of the bent-back portion 4 inside the sleeve portion 3 is not only contacted along the front face of the back surface plate 2 but also fixed integrally at a fixture portion 18 in this embodiment. As shown in FIGS. 4A and 4B the fixture portion 18 is formed by press-fitting with a partial punch-out by laying the back surface plate 2 and a bending-back portion 4 as a receiving plate and a backup plate on a receiving mold 23 having a recess 23a and by pressing both plates by lowering a punch 24 having a punch-out portion 24a from above the recess 23a.

According to this method, under the condition that only both sides, i.e., the right and left sides (or upper and lower sides) of the receiving plate (back surface plate 2) and the backup plate (bent back portion 4) are punched out and overlapped by the convex and concave portions of the receiving mold 23, receiving portions 2a and fitting portions 4a are formed. Namely, parts of the plates are kept punched out. The fitting portions 4a are pressed and fitted into the through-holes 2b of the receiving plate (back surface plate 2). Both the plates are press-fitted in a one-piece manner.

FIG. 5A, 5B and 5C show a radiator 1 according to a second embodiment. In this embodiment, the structure thereof is the same as that shown in FIGS. 1 and 2A and 2B in the point that the sleeve portions 3 with the slits 12a are formed on both sides on the right and left sides of the back surface plate 2 but different in the following points.

Namely, in this embodiment, the bent back portions 4 that are the peripheral wall ends of the sleeve portions 3 are neither close to nor in contact with the front face of the back surface plate 2 but form sleeve portions having a C-shaped cross-section. Inside end portions of the bent back portions 4 are further bent to project on the front face side to form pressure portions 26.

Then, a mountable space 9 for the heat generating elements with the peripheral walls bent in a trapezoidal shape or an arcuate shape in plan view is formed between the pressure portions 26 and the back surface plate 2. The heat generating element 5 is inserted into the mountable space 9 from below and is resiliently retained thereat. A positioning portion 27 that is composed of a rectangular retainer hole corresponding to each of the right and left sides is formed in a window shape in each of the right and left pressure portions 26. Right and left corners of the parallelepiped heat generating element 5 on the front face side are inserted into and positioned at the positioning portions 27 to thereby limit the vertical and horizontal movement of the element 5.

The same reference numerals are used to indicate the like members and components in the foregoing embodiment described in conjunction with FIGS. 1 through 4B. The explanation for those will be omitted.

Figure 6:
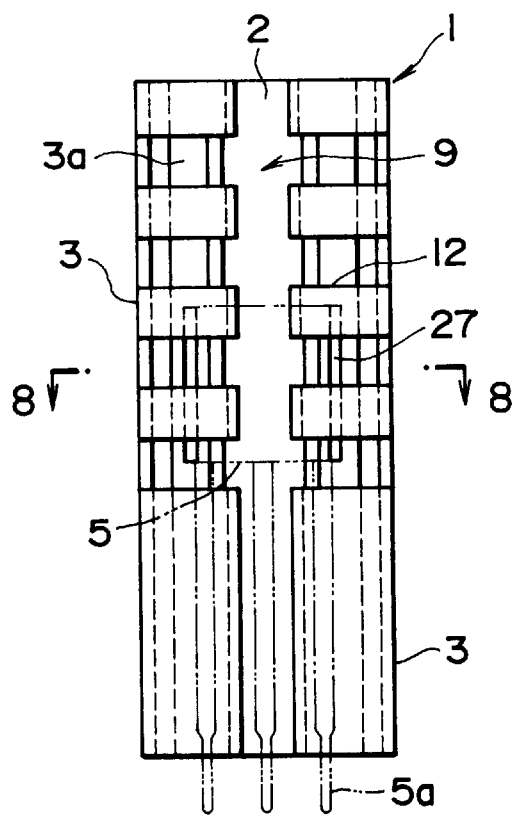
FIG. 6 is a frontal view showing a heat radiator in accordance with a third embodiment of the invention.
Figure 7:
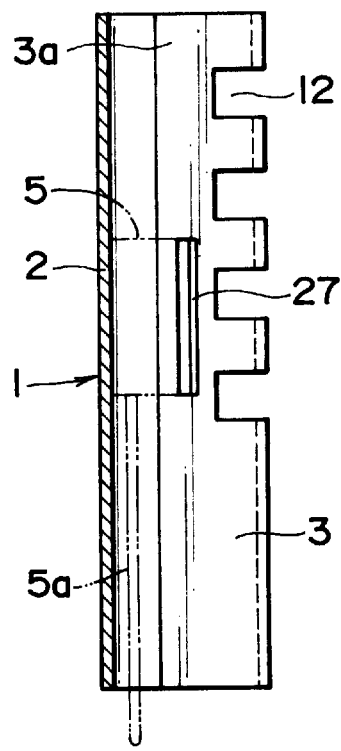
FIG. 7 is a central longitudinal sectional view of FIG. 6.
Figure 8:
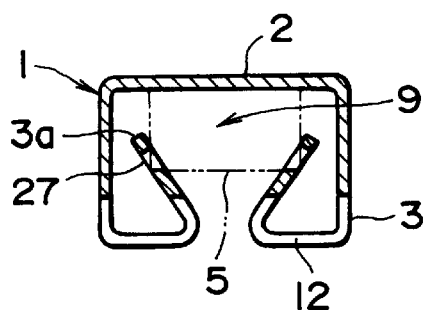
FIG. 8 is a sectional view taken along the line A—A of FIG. 6.

FIGS. 6 to 8 show a radiator according to a third embodiment of the invention. Also, in this embodiment, the radiator 1 is formed by pressing a metal plate made of aluminum or the like having a high heat conductivity. Both right and left ends of the back surface plate 2 having a vertically rectangular shape are bent substantially through a right angle to the front side as viewed from above. The bent tip end sides are further bent inwardly through about 90°° on the front face side and the further tip ends are bent through about 60°° toward the back surface plates 2 to form the sleeve portions 3 for heat radiation. The end portions of the peripheral walls of the sleeve portions 3 forms retainer plates 3a composed of longitudinal plates with back surface sides facing the back surface plates 2 obliquely inwardly.

Namely, the substantially triangular cross-sectional sleeve portions 3 that are open in the vertical direction with both final ends bent inwardly as viewed from above are formed on both sides of the back surface 2. The front ends of the above-described retainer plates 3a are used to form free ends that are out of contact with the back surface plate 2 and the side wall inner surfaces but may be swung elastically or resiliently. Also, the above-described retainer plates 3a have a V-shaped as viewed from above, as best shown in FIG. 8. The retainer plates 3a are slanted relative to the back surface plate 2 to form an element mountable space 9 composed of an inverted triangular space in cooperation with the back surface plate 2.

Furthermore, a plurality of slits 12 extending to the side wall front face side and the base end portions of the retainer plates 3a are formed in the front faces of the above-described sleeve portions 3 while remaining parts by about 40% in the lower side to thereby enhance the heat radiation characteristics of the heat generating element 5.

Namely, the heat generating element 5 such as a parallelepiped semiconductor having lead terminals 5a to be inserted and connected to a circuit board (not shown) or the like is inserted and fixed within the element mountable space 9. The back surface of heat generating element 5 is caused to move along the back surface plate 2 while expanding outwardly and resiliently deforming the right and left retainer plates 3a, to insert the heat generating element 5 vertically. The front end right and left corners of the heat generating element 5 are depressed obliquely inwardly by the resilient forces of the right and left retainer plates 3a, 3a after the insertion to thereby be positioned in place in the horizontal direction.

Under this condition, the vertical positioning may be performed by the contact friction between the front end right and left corner portions of the heat generating element 5 and the retainer plates 3a. However, in case of this embodiment shown in FIGS. 6 to 8, vertical slits having a width and a length enough to receive and retain the front end right and left corner portions of the heat generating element 5 are formed at a predetermined height of the respective retainer plates 3a to serve as positioning portions 27 to thereby more effectively ensure the positioning operation. Also, the positioning portions 27 are not always slits but may be cutaways by forming the inner end sides of the retainer plates 3a to have the same length as that of the slits.

With such a structure, since the radiator 1 is normally mounted relative to the heat generating element 5 inserted into and fixed to the printed circuit board, the heat generated from the heat generating element 5 due to the electric supply is radiated by thermal conduction through the back surface plate 2 and the retainer plates 3a, and the radiator is cooled down by the heat radiation effect or the like of the mountable space 9 and the sleeve portions 3. The radiator 1 is fixed to the circuit board through the heat generating element 5.

Figure 9:
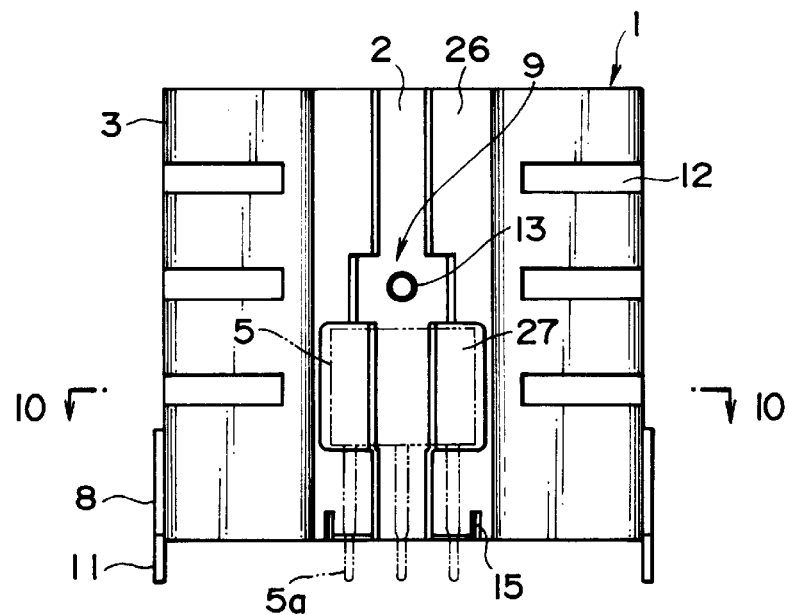
FIG. 9 is a frontal view showing a heat radiator in accordance with a fourth embodiment of the invention.
Figure 10:
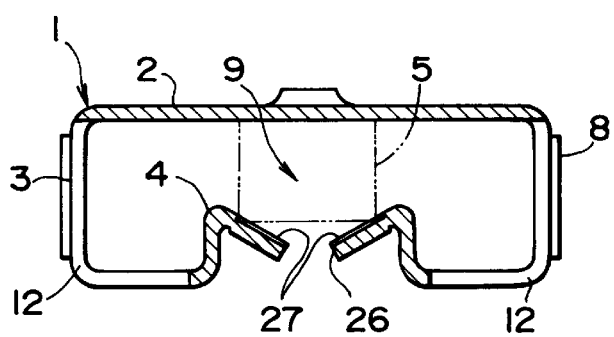
FIG. 10 is a cross-sectional view taken along the line B—B of FIG. 9.
Figure 11:
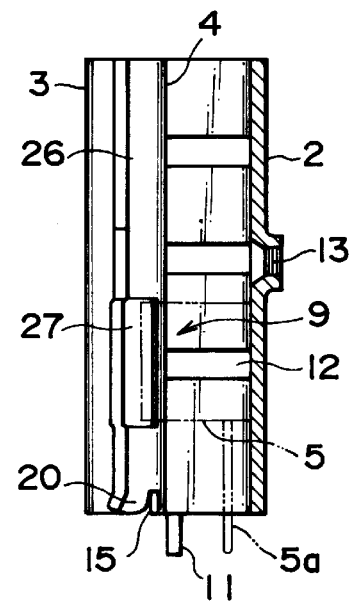
FIG. 11 is a central longitudinal sectional view of FIG. 9.

FIGS. 9 to 11 show a radiator according to a fourth embodiment of the invention. The radiator 1 has a partially common structure with the radiator shown in FIGS. 5A, 5B and 5C for the mechanism for holding the heat generating element 5. In this embodiment, the sleeve portions 3 with the slits 12 have an angular cross-section as viewed in plan view. Plate-like leg seats 8 are securely fixed the outer sides of the lower ends of the side walls of the sleeve portion 3. Pins 11 are formed downwardly at the lower end of each leg seat 8 for insertion and fixture of the radiator 1 per se to the printed circuit board or the like.

Inner ends of the bent back ends 4 of the peripheral walls of the sleeve portions 3 form plate-like pressure portions 26 which are inwardly slanted toward the back surface plate 2 on both right and left back sides. The part mountable space 9 is defined between the pressure portions 26 and the back surface plate 2.

Also, a stud hole 13 is formed in an upper half at the central portion of the back surface plate 2 by barring. The heat generating element 5 which could not be retained by the right and left pressure portions 26 and the back surface plate 2 or could insufficiently be held by them may be retained by the stud hole 13.

Also, in this embodiment, positioning portions 27 have rectangular recesses that are formed into recesses corresponding to a length and a width of the heat generating element 5 by the semi-punching formation from the back faces of the pressure portions 26 and 26. Then, both the front face side right and left corner portions of the heat generating element 5 is received in and retained at those recesses, and depressed and fixed inwardly from both right and left sides and resiliently to be securely positioned back and forth, right and left, and up and down.

Figure 12:
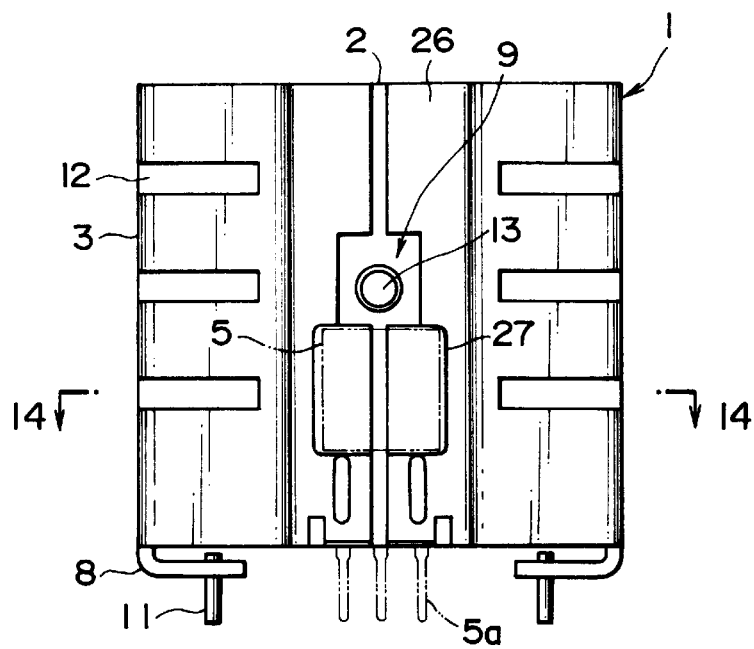
FIG. 12 is a frontal view showing a heat radiator in accordance with a fifth embodiment of the invention.
Figure 13:
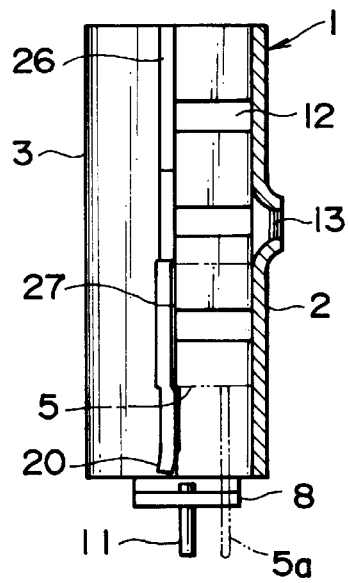
FIG. 13 is a central longitudinal sectional view of FIG. 12.
Figure 14:
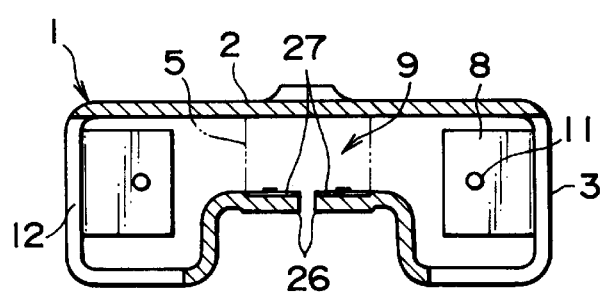
FIG. 14 is a cross-sectional view taken along the line C–C of FIG. 12.

Also, cutaway-like slits 15 are formed in a position close to the outside of the lower end of each pressure portion 26. The lower ends of the inside portions of the slits 15 are pressingly expanded forwardly to be curved to form an insertion guide portion 20 so that the heat generating element may readily and smoothly be inserted from below. The other portions and structure are the same as those of the embodiment shown in FIGS. 5A, 5B and 5C. The same reference numerals are used to indicate the like members and components in this embodiment, FIGS. 12 to 14 show a radiator according to a fifth embodiment of the invention. In this embodiment, the structure for the sleeve portions 3 with the slits 12 and the back surface plate 2 is commonly used as in the foregoing fourth embodiment. However, the pressure portions 26 are formed to be bent so as to be substantially in parallel with the back surface plate 2. As a result, the difference between the fifth embodiment and the fourth embodiment is that the positioning portions 27 recessed in the back surfaces of the pressure portions 26 are substantially in contact with the front face side of the heat generating element 5; and the mountable leg seats 8 are bent inwardly in an L-shape in cross-section with outer side walls extending below the sleeve portions 3 and with pins 11 being securely and vertically inserted into the bent ends.

In this embodiment, the positioning portions 27 per se are in intimate contact with the heat generating element 5 so that the heat radiation is performed by the heat conductivity. This is different from the third and fourth embodiments in which ambient air of the heat generating element 5 is caused to flow for heat radiation.

FIGS. 15 to 17 show a sixth embodiment of the present invention. The structure of the radiating portion shown there is common with that shown in FIGS. 1 and 2A and 2B. Namely, in this embodiment, sleeve portions 3 in which ventilation slits 12a are formed are provided on both right and left sides of the back surface plate 2. Channel-like bent back portions 4 which are fixed to fixture portions 18 of the back surface plate 2 and bent back ends 6 provided with slits 12b held upright toward the front side are formed inside both sleeve portions 3.

However, in this embodiment, the stud hole 13 is formed from the back side for mounting the heat generating element 5 on the back side of the back surface plate 2. The boss portion thereof protrudes on the front side. Inversely, in the case where the boss portion of the stud hole 13 is not protruded on the front side, it is possible to mount the heat generating element 5 on the front surface side of the back surface plate 2 as the mountable space 9 defined between the right and left bent back ends 6, 6.

Also, the leg seats 8 are made from a plate bent in a gate as viewed from above. The back surfaces thereof are fixed to the lower front surface side of the back surface plate 2 by the press-fitting portions 18a. Insertion fastening pins 11 directed downwardly are integrally formed at the lower rear end positions of the leg seats 8.

Figure 18:
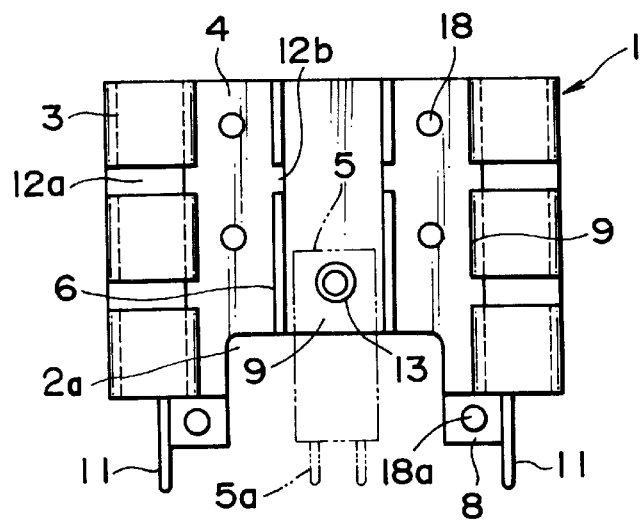
FIG. 18 is a frontal view showing a radiator in accordance with a seventh embodiment of the invention.
Figure 19:
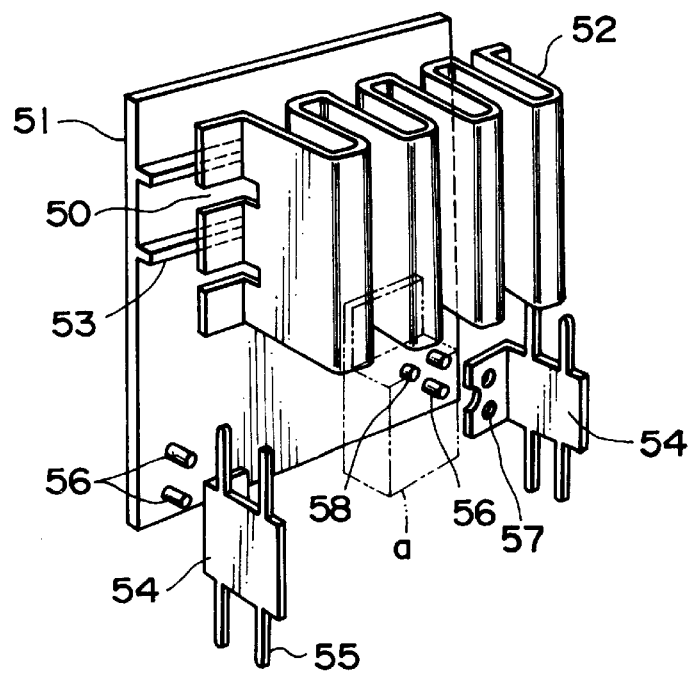
FIG. 19 is a perspective view showing one example of a conventional heat radiator.

FIG. 18 is a frontal view showing a radiator according to a seventh embodiment of the invention. In comparison with the radiator according to the sixth embodiment shown in FIGS. 15 to 17, the structure is almost commonly utilized for the seventh embodiment except for a slight difference in structure concerning the part mountable space 9 and the leg seats 8.

Namely, in the radiator shown in FIG. 18, on the inner sides of the right and left sleeve portions 3, 3, the lower end portion of the back surface plate 2, the bent back portions 4 and the bent back ends 6 define a cutaway portion having a gate-shape as viewed from the front side. The upper central portion of the cutaway portion 2a defines the part mountable space 9. As a result, in the case where the heat generating element 5 is mounted from the back surface side as shown, the lower half of the heat generating element 5 is cooled down under the condition that it is out of contact with the back surface plate 2.

Also, the difference is that in this embodiment, L-shaped cross-sectional leg seats 8, 8 formed separately on right and left sides are fixed to the lower end of the back surface plate 2 on both sides of the gate-like cutaway portion 2a. Also, in this embodiment, in the case where the boss portion of the stud hole 13 is not protruded on the front side, it is possible to mount the heat generating element on the front side.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed is:

1. A heat radiator for electronic parts, in which both right and left ends of a back surface plate (2) on which a heat generating element (5) that is an electronic part is mounted on a surface on a front face side are bent on the front face side or the back face side to form a heat radiative portion in a longitudinal direction, said radiative portion being bent further inwardly to form a vertical sleeve portion (3); and slits (12a) are formed in a peripheral wall of said sleeve portion (3) for causing air to flow, wherein the bent back portion (4) is formed to be bent toward the back surface plate (2) inside right and left sleeve portions (3) by bending bentback end sides of the peripheral walls of the sleeve portions (3) so that said bentback portion comes into contact with the front face of the back surface plate (2) along the front face and is securely fixed to the back surface plate (2).

2. The heat radiator according to claim 1, wherein an inner end of the bent back portion (4) is raised upright on the front face side of the back surface plate (2) to be an upright plate for heat radiation.

* * * * *